US010480970B2

(12) United States Patent
Li

(10) Patent No.: US 10,480,970 B2
(45) Date of Patent: Nov. 19, 2019

(54) ELECTROMAGNETIC FLOW SENSOR INTERFACE ALLOWING DIFFERENTIAL DC COUPLING

(71) Applicant: Analog Devices Global, Hamilton (BM)

(72) Inventor: Ke Li, Mungret (IE)

(73) Assignee: Analog Devices Global, Hamilton (BM)

( * ) Notice: Subject to any disclaimer, the term of this patent is extended or adjusted under 35 U.S.C. 154(b) by 405 days.

(21) Appl. No.: 14/975,026

(22) Filed: Dec. 18, 2015

(65) Prior Publication Data

US 2017/0153135 A1    Jun. 1, 2017

Related U.S. Application Data

(63) Continuation of application No. PCT/CN2015/097399, filed on Dec. 15, 2015.

(30) Foreign Application Priority Data

Nov. 30, 2015    (CN) .......................... 2015 1 0860302

(51) Int. Cl.
 *G01F 1/60*        (2006.01)
 *G01F 1/58*        (2006.01)
 (Continued)

(52) U.S. Cl.
 CPC ................ *G01F 1/60* (2013.01); *G01F 1/584* (2013.01); *G01F 1/586* (2013.01); *H01F 7/064* (2013.01);
 (Continued)

(58) Field of Classification Search
 CPC .... G01R 7/06; G01R 19/0092; G01R 15/207; G01R 15/202; G01R 15/205
 (Continued)

(56) References Cited

U.S. PATENT DOCUMENTS 4,953,068 A    8/1990  Henze
5,271,280 A  * 12/1993  Nissen ...................... G01F 1/60
                                                                    73/861.12

(Continued)

FOREIGN PATENT DOCUMENTS

CN        101260934        9/2008
CN        101529790        9/2009
 (Continued)

OTHER PUBLICATIONS

Gauger, Dan, et al. "A three-phase off-line switching power supply with unity power factor and low TIF." Telecommunications Energy Conference, 1986. INTELEC'86. International. IEEE, 1986.*
 (Continued)

*Primary Examiner* — Christopher P McAndrew
(74) *Attorney, Agent, or Firm* — Schwegman Lundberg & Woessner, P.A.

(57) ABSTRACT

An interface circuit to an electromagnetic flow sensor is described. In an example, it can provide a DC coupled signal path from the electromagnetic flow sensor to an analog-to-digital converter (ADC) circuit. Examples with differential and pseudo-differential signal paths are described. Examples providing DC offset or low frequency noise compensation or cancellation are described. High input impedance examples are described. Coil excitation circuits are described, such as can provide on-chip inductive isolation between signal inputs and signal outputs. A switched mode power supply can be used to actively manage a bias voltage of an H-Bridge, such as to boost the current provided by the H-Bridge to the sensor coil during select time periods, such as during phase shift time periods of the coil, which can help reduce or minimize transient noise during such time periods.

20 Claims, 7 Drawing Sheets

(51) Int. Cl.
*H01F 7/06* (2006.01)
*H03F 3/04* (2006.01)
*H03F 3/45* (2006.01)
*H03M 1/12* (2006.01)
*H03M 1/66* (2006.01)
*H01F 27/28* (2006.01)

(52) U.S. Cl.
CPC .......... *H01F 27/2804* (2013.01); *H03F 3/04* (2013.01); *H03F 3/45076* (2013.01); *H03M 1/12* (2013.01); *H03M 1/66* (2013.01); *H03F 2200/129* (2013.01); *H03F 2200/261* (2013.01); *H03F 2203/45116* (2013.01)

(58) Field of Classification Search
USPC ........................................................ 324/144
See application file for complete search history.

(56) References Cited

U.S. PATENT DOCUMENTS

| | | | | |
|---|---|---|---|---|
| 5,325,728 | A * | 7/1994 | Zimmerman | A61B 5/0265 600/504 |
| 5,805,241 | A * | 9/1998 | Limberg | H04N 5/52 329/304 |
| 6,611,775 | B1 * | 8/2003 | Coursolle | G01D 3/032 702/65 |
| 6,697,006 | B1 * | 2/2004 | McCartney | H03M 1/124 341/143 |
| 10,352,742 | B2 | 7/2019 | Li | |
| 2002/0069986 | A1 * | 6/2002 | Marcoccia | D21C 7/12 162/60 |
| 2007/0139103 | A1 * | 6/2007 | Roeckner | H03F 1/305 330/10 |
| 2007/0220992 | A1 * | 9/2007 | Lam | G01F 1/58 73/861.15 |
| 2008/0243021 | A1 * | 10/2008 | Causevic | A61B 5/0002 600/544 |
| 2009/0021175 | A1 * | 1/2009 | Wendt | H02M 3/3376 315/200 R |
| 2009/0038944 | A1 * | 2/2009 | Kruger | C02F 1/4602 204/555 |
| 2010/0079085 | A1 | 4/2010 | Wendt et al. | |
| 2012/0154032 | A1 * | 6/2012 | Lesso | H03F 1/304 330/109 |
| 2014/0021825 | A1 * | 1/2014 | Ocalan | H02N 11/002 310/300 |
| 2014/0083199 | A1 * | 3/2014 | Rogers | G01F 1/584 73/861.12 |
| 2015/0082906 | A1 * | 3/2015 | Foss | G01F 1/60 73/861.12 |
| 2015/0177035 | A1 * | 6/2015 | Rovner | G01F 1/584 73/861.12 |
| 2017/0153134 | A1 | 6/2017 | Li | |
| 2017/0154715 | A1 | 6/2017 | Li | |

FOREIGN PATENT DOCUMENTS

| | | | | |
|---|---|---|---|---|
| CN | 103453954 | | 12/2013 | |
| GB | 2101330 | A * | 1/1983 | ......... G01N 15/0656 |
| GB | 2101330 | A * | 1/1983 | ......... G01N 15/0656 |

OTHER PUBLICATIONS

U.S. Appl. No. 14/974,744, filed Dec. 18, 2015, Electromagnetic Flow Sensor Interface Including Sensor Drive Circuit.
U.S. Appl. No. 14/974,891, filed Dec. 18, 2015, Electromagnetic Flow Sensor Interface Allowing DC Coupling.
"U.S. Appl. No. 14/974,744, Response filed Jul. 20, 2018 to Non Final Office Action dated May 17, 2018", 11 pgs.
"U.S. Appl. No. 14/974,891, Notice of Allowance dated Sep. 21, 2018", 10 pgs.
"U.S. Appl. No. 14/974,891, Response filed Jul. 20, 2018 to Non Final Office Action dated May 17, 2018", 12 pgs.
"U.S. Appl. No. 14/974,744, Non Final Office Action dated May 17, 2018", 30 pgs.
"U.S. Appl. No. 14/974,891, Non Final Office Action dated May 17, 2018", 29 pgs.
"U.S. Appl. No. 14/974,744, Notice of Allowance dated Nov. 16, 2018", 9 pgs.
"U.S. Appl. No. 14/974,891, Corrected Notice of Allowability dated Nov. 1, 2018", 7 pgs.
"Chinese Application Serial No. 201611070365.7, Office Action dated Jan. 2, 2019", w/ English translation, 9 pgs.
"U.S. Appl. No. 14/974,744 Supplemental Amendment Filed Dec. 21, 2018", 8 pgs.
"U.S. Appl. No. 14/974,891 Supplemental Amendment Filed Dec. 21, 2018", 8 pgs.
"U.S. Appl. No. 14/974,744, Non Final Office Action dated Feb. 20, 2019", 25 pgs.
"U.S. Appl. No. 14/974,744, Notice of Allowance dated May 14, 2019", 9 pgs.
"U.S. Appl. No. 14/974,744, Response filed Apr. 23, 2019 to Non Final Office Action dated Feb. 20, 2019", 10 pgs.
"U.S. Appl. No. 14/974,891, Non Final Office Action dated Mar. 21, 2019", 27 pgs.
"U.S. Appl. No. 14/974,891, Response filed Jun. 10, 2019 to Non Final Office Action dated Mar. 21, 2019", 10 pgs.
"U.S. Appl. No. 14/974,891, Notice of Allowance dated Jun. 26, 2019", 10 pgs.

* cited by examiner

ELECTROMAGNETIC FLOW SENSOR INTERFACE ALLOWING DIFFERENTIAL DC COUPLING

CLAIM OF PRIORITY

This patent application claims the benefit of priority of each of: (1) Chinese Patent Application Number 201510860302.0, filed on Nov. 30, 2015; and (2) PCT Patent Application PCT/CN2015/097399, filed on Dec. 15, 2015, which, in turn, claims the benefit of priority of Chinese Patent Application Number 201510860302.0, filed on Nov. 30, 2015.

BACKGROUND

An electromagnetic flow sensor can be used to detect fluid flow through a conduit. A constant excitation current can be delivered to a coil, which can generate an electromagnetic field in the conduit. A response signal can be detected by sensing electrodes of the electromagnetic flow sensor. The response signal can include information about the fluid flow. A sensor interface circuit can be used to provide control signals to generate a coil excitation current and to provide signal processing of the response signal. For example, U.S. Pat. No. 6,693,486 includes an example of a magnetoinductive flowmeter interface circuit.

OVERVIEW

The present inventors have recognized, among other things, that a problem to be solved can include providing a high performance, low cost, space-efficient interface circuit to an electromagnetic flow sensor. The present subject matter can help provide a solution to this problem, for example, such as by providing a DC coupled signal path from the electromagnetic flow sensor to an analog-to-digital converter (ADC) circuit, which does not require AC coupling capacitors, which require space and the mismatch of which can degrade performance. Examples with differential and pseudo-differential signal paths are described. Examples providing DC offset or low frequency noise compensation or cancellation are described, which can help compensate for DC offset that can wise at sensing electrodes of an electromagnetic flow sensor or elsewhere in the signal processing circuitry. High input impedance examples are described. Coil excitation circuits are described, such as can include electrical isolation without requiring optical components, such as by providing an on-chip inductive isolation between signal inputs and signal outputs. A switched mode power supply can be used to actively manage a bias voltage of an H-Bridge, such as to boost the current provided by the H-Bridge to the sensor coil during select time periods, such as during phase shift time periods of the coil, which can help reduce or minimize transient noise during such time periods.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
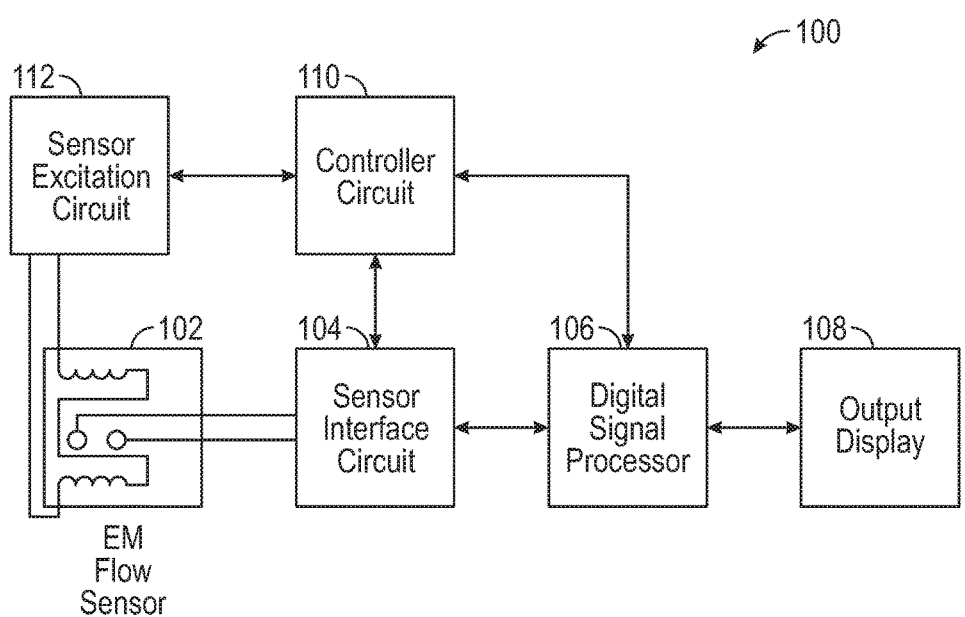
FIG. 1 shows an example of an electromagnetic flow sensor system, such as for sensing fluid flow.

FIG. 1 shows an example of an electromagnetic flow sensor system 100, such as for sensing fluid flow. Operating the electromagnetic flow sensor system 100 can include using an electromagnetic flow sensor 102, processing the resulting signal, and controlling excitation of the electromagnetic sensor. In FIG. 1, the electromagnetic flow sensor 102 can include an inductive coil for generating an electromagnetic (EM) field, such as an EM field in a conduit in which fluid flow is to be sensed. The electromagnetic flow sensor 102 can include sensing electrodes, such as for detecting a response signal, in response to the generated electromagnetic field, that can include information about the sensed fluid flow. A sensor interface circuit 104 can receive the response signal, condition it, and convert it to a digital signal that can include information about the sensed fluid flow. A digital signal processor (DSP) 106 can receive the digital signal, and can perform filtering or other signal conditioning or processing in the digital domain. Resulting fluid flow information can be provided to an output display 108, or to other circuitry, such as for use in a feedback arrangement to a fluid flow valve or other component for controlling the fluid flow. A microprocessor or other controller circuit 110 can communicate with one or both of the sensor interface circuit 104 and the DSP 106. The controller 110 can also communicate with a sensor excitation circuit 112, such as for controlling a drive current provided to the electromagnetic coil of the electromagnetic flow sensor 102.

Figure 2:
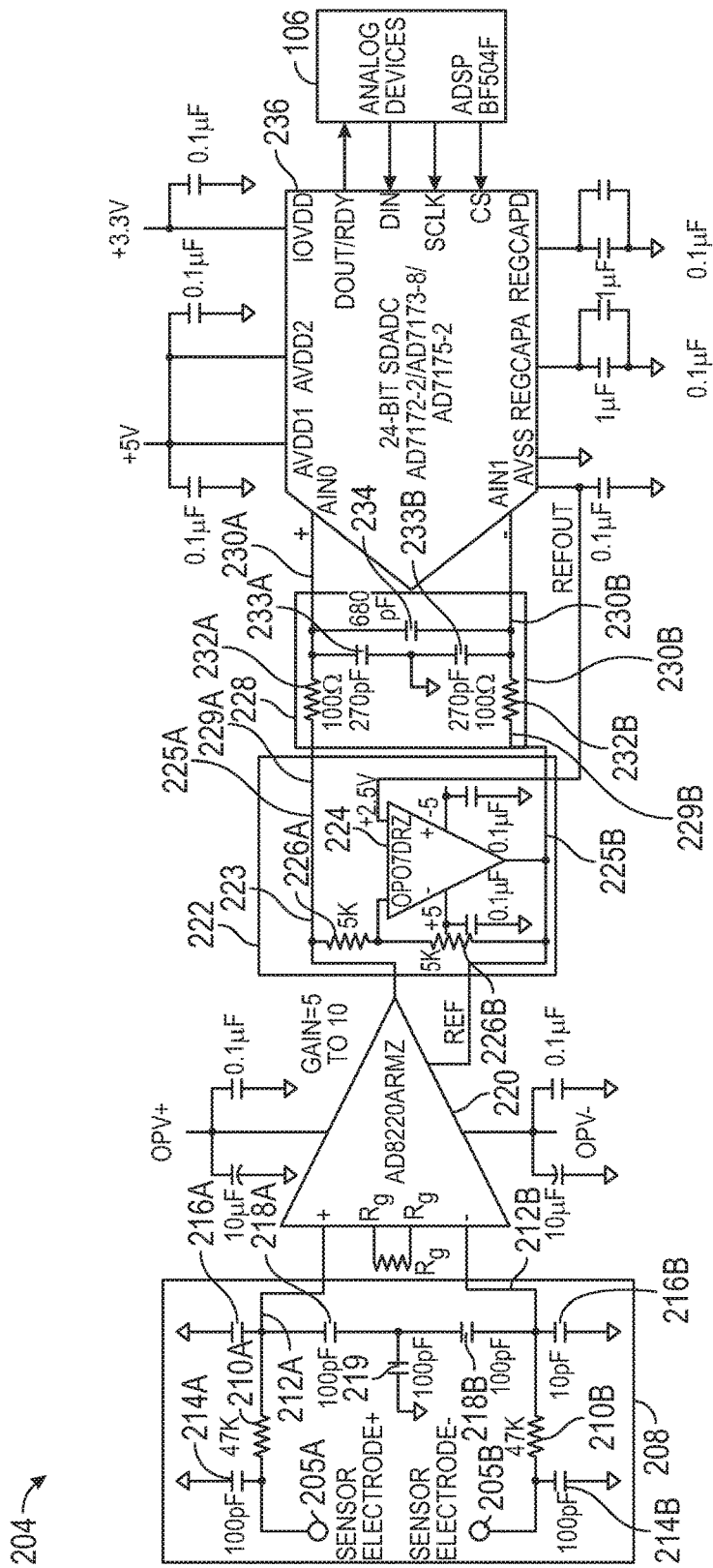
FIG. 2 shows an example of the sensor interface circuit, such as can provide DC-coupled, differential signal processing for the response signal received from an electromagnetic flow sensor.

FIG. 2 shows an example of the sensor interface circuit 104, such as can provide DC-coupled, differential signal processing for the response signal received from the electromagnetic flow sensor 102. In FIG. 2, the sensor interface circuit 204 can include first and second inputs 205A, 205B, such as can be electrically connected to the sensor electrodes of the electromagnetic flow sensor 102. A passive or other radio-frequency interference (RFI) attenuation filter circuit 208 can be electrically connected to the first and second inputs 205A-B, such as to receive the response signal from the electromagnetic flow sensor 102, and to attenuate RF or other electromagnetic interference signals that may be present, such as in the environment in which fluid flow is being sensed. In an example, the RFI attenuation filter circuit 208 can include respective resistors 210A-B (e.g., 47 Kohms) in series between the respective first and second inputs 205A-B and respective first and second RFI attenuation filter circuit outputs 212A-B. Respective capacitors 214A-B (e.g., 100 pF) can be located between the respective first and second inputs 205A-B and a reference or ground node. Respective capacitors 216A-B (e.g., 10 pF) can be located between the respective first and second RFI attenuation filter circuit outputs 212A-B and a reference or ground node. Respective capacitors 218A-B (e.g., 100 pF) can respectively be located between the respective first and second RFI attenuation filter circuit outputs 212A-B and an intermediate node, from which a capacitor 219 (e.g., 100 pF) can extend to a reference or ground node.

An instrumentation amplifier circuit 220 can be electrically coupled to the first and second inputs 205A-B, such as through the RFI attenuation filter circuit 208, such as by electrically connecting the RFI attenuation filter circuit outputs 212A-B to respective signal inputs of the instrumentation amplifier circuit 220. In an example, the instrumentation amplifier circuit 220 can include an AD8220ARMZ instrumentation amplifier circuit, such from Analog Devices, Inc., of Norwood, Mass., USA, and can be configured with a signal gain of between 5 and 10, such as with a gain of 5.

A single-ended-to-differential signal conversion circuit 222 can include a signal input 223 that can be electrically connected to receive a single-ended output signal of the instrumentation amplifier circuit 220, and convert the received single-ended signal into a differential output signal. In an example, the single-ended-to-differential signal conversion circuit 222 can include an operational amplifier 224, such as an Analog Devices, Inc. OP07DRZ operational amplifier circuit. The signal input 223 of the single-ended-to-differential conversion circuit 222 can be electrically connected to a first output 225A of the single-ended-to-differential conversion circuit 222, which can also include a second output 225B. An inverting signal input of the operational amplifier 224 can be connected to the signal input 223, such as via a resistor 226A (e.g., 5 Kohms), and to the second output 225B, such as via a resistor 226B (e.g., 5 Kohms). An output of the operational amplifier 224 can be connected to the second output 225B. A non-inverting input of the operational amplifier 224 can be connected to a stable reference voltage (e.g., 2.5V), such as at a fixed or adjustable bias voltage such as can be in the middle of a signal output range of the single-ended-to-differential conversion circuit 222.

An RFI attenuation filter circuit 228 can include differential signal inputs 229A-B that can be respectively coupled to the outputs 225A-B of the single-ended-to-differential signal conversion circuit 222. The RFI filter attenuation circuit 228 can include differential signal outputs 230A-B. The RFI filter attenuation circuit 228 can include resistors 232A-B (e.g., 100 ohms) that can respectively be located between the respective signal inputs 229A-B and the respective signal outputs 225A-B. Capacitors 233A-B (e.g., 270 pF) can be respectively located between the signal outputs 230A-B and a reference or ground node. A capacitor 234 (e.g., 680 pF) can be located between the signal outputs 230A-B.

An analog-to-digital converter (ADC) circuit 236 can include differential signal inputs that can be electrically coupled to the signal outputs 225A-B of the single-ended-to-differential signal conversion circuit 222, such as through the RFI attenuation circuit 228, such as via its signal outputs 230A-B. In an example, the ADC circuit 236 can include a 24-bit sigma-delta ADC such as can be capable of operating at 31 Kilo-samples per second or faster. Examples of ADC circuit 236 can include Analog Devices, Inc.'s AD7172-2, AD7173-8, AD7175-2 ADC circuits. A reference voltage output of the ADC circuit 236 can be used to provide the stable bias voltage at the non-inverting input of the operational amplifier 224 of the single-ended-to-differential signal conversion circuit 222.

A digital output signal from the ADC circuit 236 can be provided to the digital signal processor (DSP) circuit 106, such as for digitally performing further signal conditioning of signal including the flow information. In an example, the DSP circuit 106 can include an Analog Devices, Inc. ADSP-BF504F, such as can operate at 400 MHz and can digitally perform FIR filtering, such as bandpass filtering using a rectangular window FIR filter. In an example, the FIR filter can include 1875 taps and can have a passband between the frequencies of 0.1 Hz and 10 Hz. The FIR filter can help reduce or eliminate wideband or other noise outside of the passband frequencies. The DSP circuit 106 can also be configured to decimate the signal received from the ADC 236, such as by downsampling from a frequency of 30 KHz to 6.25 Hz.

The sensor interface circuit 204 of FIG. 2 can be DC-coupled it does not require any AC-coupling capacitors in the signal flow path. This can offer certain advantages over other approaches to electromagnetic flow sensor signal processing, such as approaches using analog synchronous demodulation or oversampling, which can require AC-coupling. In certain examples, the sensor interface circuit 204 of FIG. 2 can be implemented with one or more of fewer components, reduced space, lower cost, lower power, or better linearity than an analog synchronous demodulation approach. Also, as compared to an oversampling approach, the sensor interface circuit 204 of FIG. 2 can provide better common mode rejection ratio (CMRR) than an approach requiring AC coupling capacitors that typically exhibit a mismatch. AC coupling can also introduce a phase shift between the positive and negative sensor excitation phases, which can be reduced or avoided using the sensor interface circuit 204 of FIG. 2. Also, certain resistors used in certain other approaches may introduce considerable thermal noise into the system, which may adversely impact the signal-to-noise ratio (SNR), which can be reduced or avoided using the sensor interface circuit 204 of FIG. 2.

Figure 3:
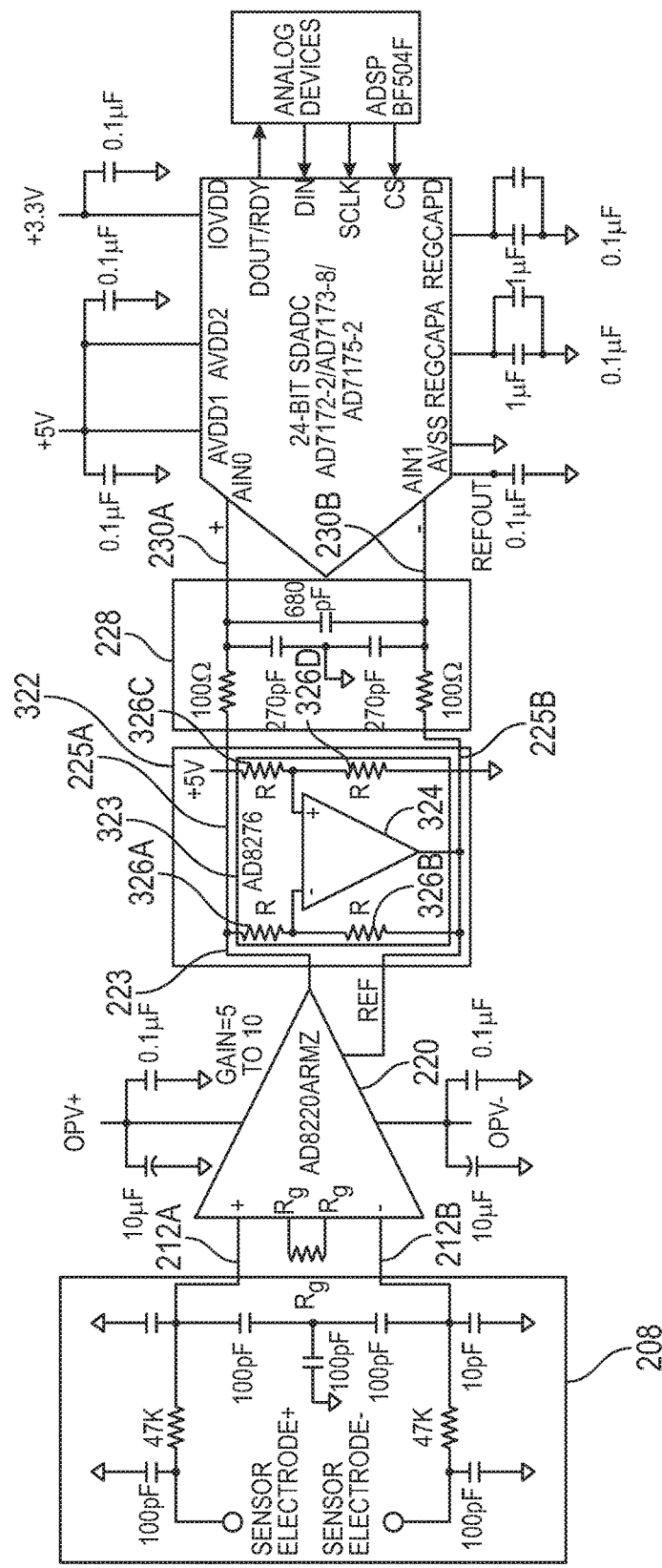
FIG. 3 shows an example of a sensor interface circuit, similar to FIG. 2, but using another version of a single-ended-to-differential signal conversion circuit.

FIG. 3 shows an example of a sensor interface circuit 104, similar to that shown in FIG. 2, but using another version of a single-ended-to-differential signal conversion circuit. In FIG. 3, the single-ended-to-differential signal conversion circuit 322 can include a signal input 223 that can be electrically connected to receive a single-ended output signal of the instrumentation amplifier circuit 220, and can be configured to convert the received single-ended signal into a differential output signal that can be provided at nodes 225A-B. In an example, the single-ended-to differential signal conversion circuit 322 can include an integrated difference amplifier 323, such as an Analog Devices, Inc. AD8276, which can include an operational amplifier 324 and resistors 326 that are integrated together on the same integrated circuit chip. Among other things, this can allow the integrated resistors to be laser-trimmed or otherwise accurately matched to each other. Resistors 326A-B can be connected in series with each other between the input 223 and the output 225B, with a node intermediate between resistors 326A-B connected to an inverting signal input of the operational amplifier 324. Resistors 326C-D can be connected in series with each other between a supply voltage node (e.g., 5V) and a reference or ground node, with an intermediate node between the resistors 326C-D connected to a non-inverting signal input of the operational amplifier 324, such as to provide a stable bias voltage (e.g., 2.5V) to the non-inverting input of the operational amplifier 324, such as a voltage that can be at or near the middle of an input voltage range of the ADC circuit 236 located later in the signal flow path in FIG. 3. The accurately matched integrated resistors 326A-D can provide better CMRR than unmatched discrete resistors.

Figure 4:
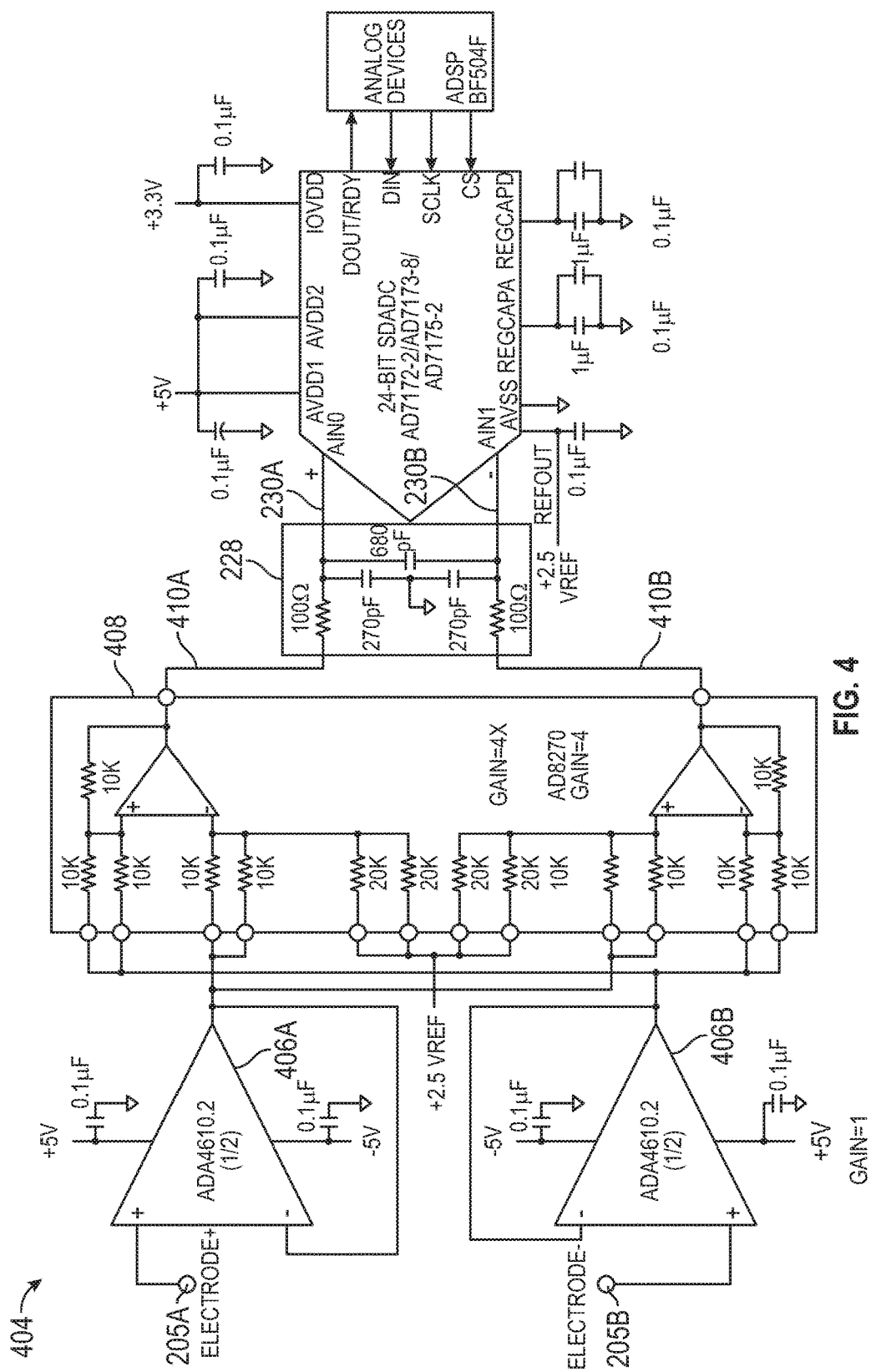
FIG. 4 shows an example of a sensor interface circuit, such as can include high input impedance buffer amplifiers and an integrated difference amplifier.

FIG. 4 shows an example of a sensor interface circuit 104, such as a sensor interface circuit 404. Respective buffer amplifiers 406A-B can respectively include non-inverting inputs that can be coupled to the first and second inputs 205A-B from the electromagnetic flow sensor 102. The buffer amplifiers 406A-B can include Analog Devices, Inc. ADA4610-2 operational amplifier circuits, or other operational amplifier circuits with junction field-effect transistor (JFET) or other field-effect transistor (FET) inputs, such as can present a high gate terminal input impedance (e.g., $10^{13}$ ohms) to the electromagnetic flow sensor 102. The inverting inputs of the buffer amplifiers 406A-B can respectively be coupled to respective outputs of the buffer amplifiers 406A-B, such as to configure the buffer amplifiers 506A-B into a low (e.g., unity) gain, high bandwidth amplifying configuration.

Respective outputs of the respective buffer amplifiers 406A-B can be respectively coupled to an integrated difference amplifier 408. The integrated difference amplifier 408 can include Analog Devices, Inc. AD8270 integrated difference amplifier, which can include two operational amplifiers, with respective inverting inputs configured to receive input signals from the outputs of the buffer amplifiers 406A-B. The integrated difference amplifier 408 can also include laser-trimmed or other matched integrated resistors to establish input and feedback resistances of the operational amplifiers, such as to set a desired closed loop gain (e.g., a gain of 4). Non-inverting inputs of the operational amplifiers of the integrated difference amplifier 408 can be electrically coupled, such as via integrated resistors, to a stable bias voltage (e.g., 2.5V), such as can be in a middle of the input range of the ADC circuit 236 that appears later in the signal flow path of the sensor interface circuit 404. Differential signal outputs 410A-B of the integrated difference amplifier 408 can be coupled to differential inputs of the ADC circuit 236, such as through an RFI attenuation filter circuit 228. The sensor interface circuit 404 can offer DC coupling—it does not require any AC coupling capacitors in the signal flow path—and differential signaling. It also can provide an extremely high input impedance, which can help avoid loading the electromagnetic flow sensor 102, which can further improve the SNR.

Figure 5:
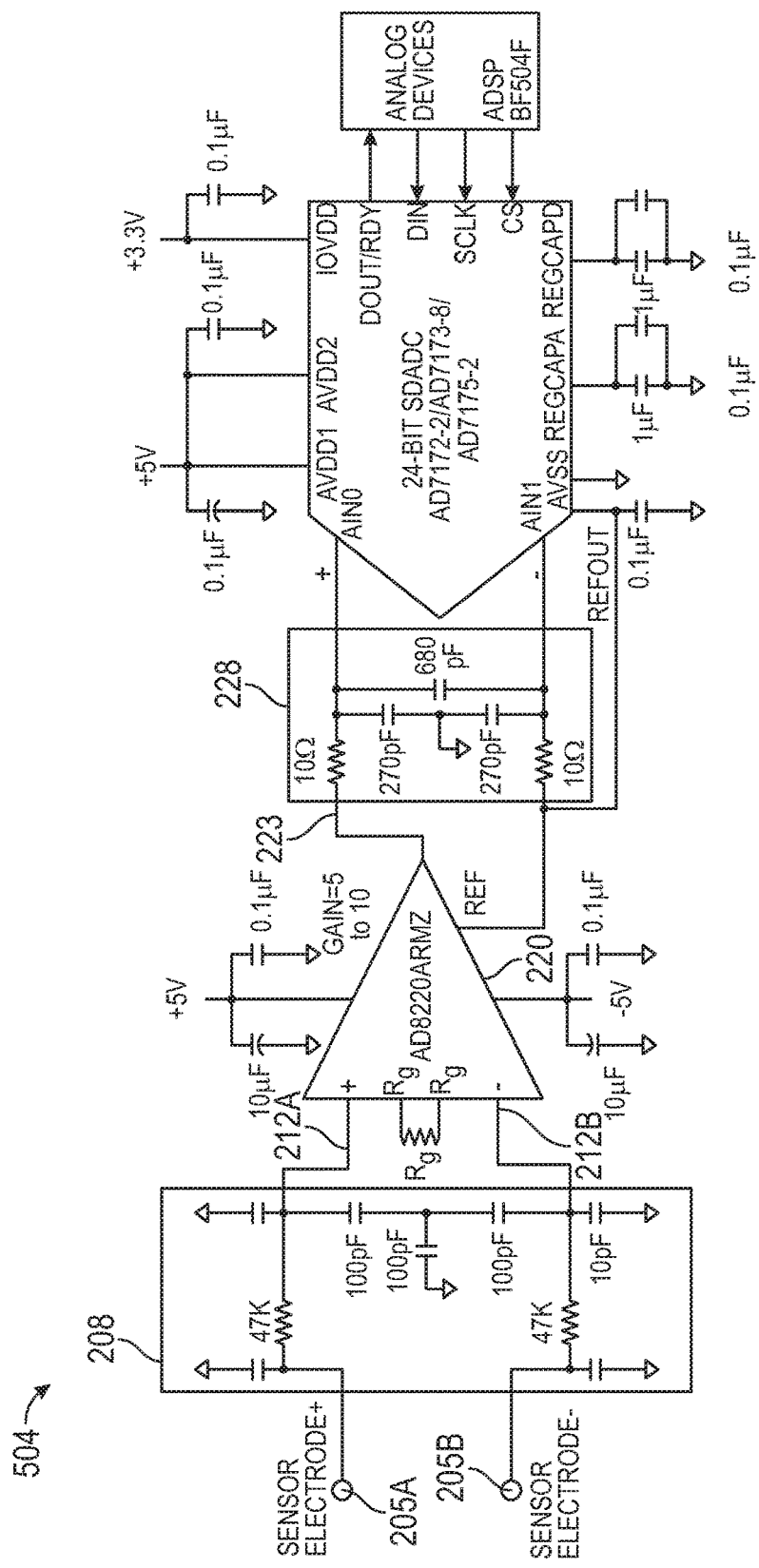
FIG. 5 shows an example of a sensor interface circuit that can provide a pseudo-differential signal path.

FIG. 5 shows an example of a sensor interface circuit 104, such as a sensor interface circuit 504. In this or other examples, the signal inputs of an instrumentation amplifier 220 can be coupled to the signal inputs 205A-B from the electromagnetic flow sensor 102, directly or via an RFI attenuation circuit 208 (not shown). In this example, the single-ended-to-differential signal conversion circuits 222, 322 need not be included. A reference voltage input of the instrumentation amplifier 220 can be connected to a stable reference voltage (e.g., 2.5 V), which can be connected to a reference voltage output of the ADC circuit 236, which can provide a stable reference voltage at or near the middle of the signal input voltage range of the ADC circuit 236. The single-ended output voltage at 223 from the instrumentation amplifier 220 can be coupled to a non-inverting signal input of the ADC circuit 236, such as through the RFI attenuation circuit 228. A reference voltage input of the instrumentation amplifier 220 can also be connected to the input 229B of the RFI attenuation circuit 228. The sensor interface circuit 504 can provide a DC coupled signal path (e.g., without requiring AC coupling capacitors, such as explained above), with pseudo-differential signaling to the ADC circuit 236.

Figure 6:
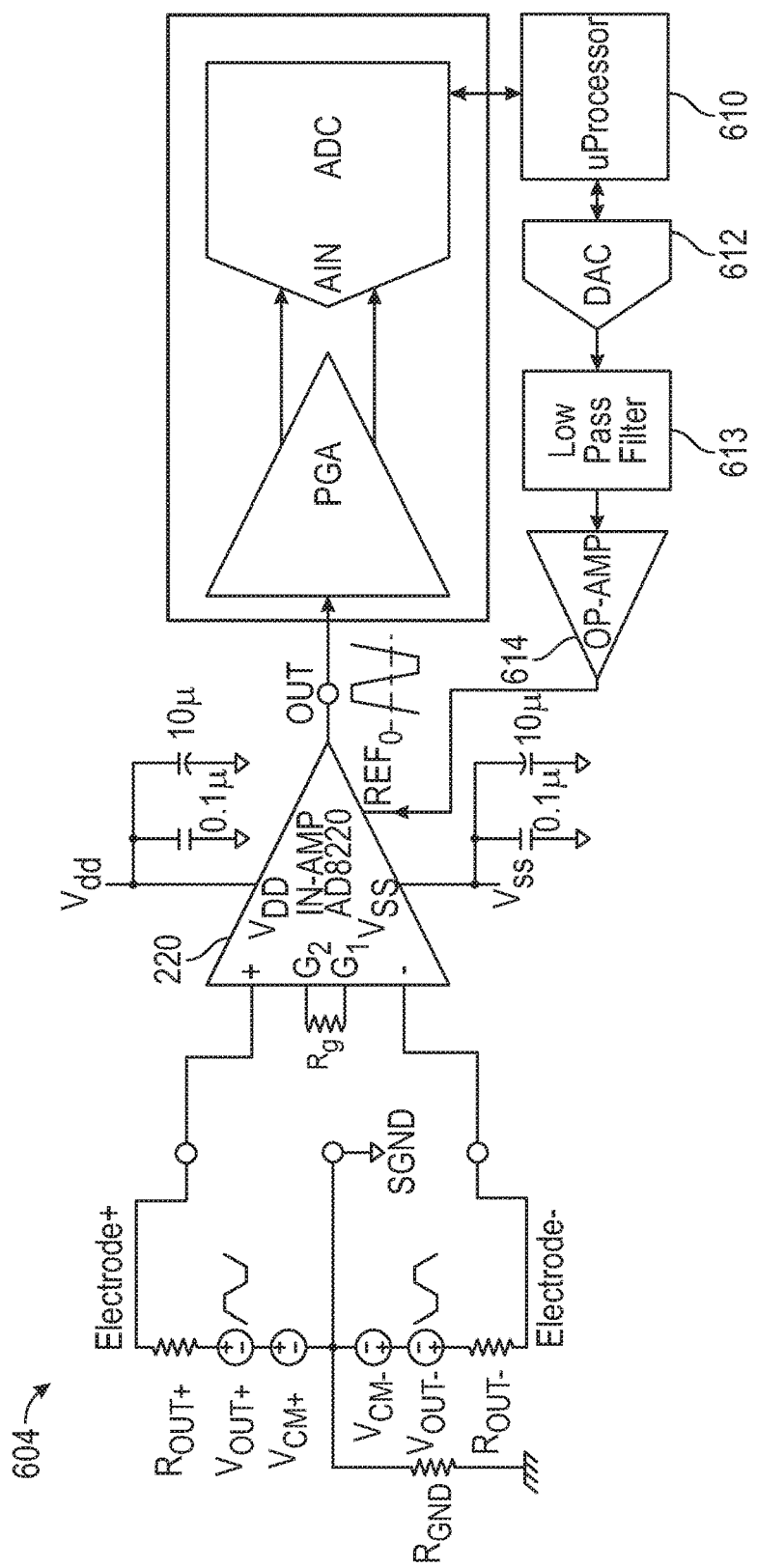
FIG. 6 shows an example of a sensor interface circuit that can provide DC or low frequency offset compensation or cancellation.

FIG. 6 shows an example of a sensor interface circuit 104, such as a sensor interface circuit 604, that can provide DC or low frequency offset compensation or cancellation, such as to compensate for or remove the effect of a DC offset that can sometimes appear across the electrodes of the electromagnetic flow sensor 102, either at manufacture, or later after use of the electromagnetic flow sensor 102. The conditioned sensor signal output by the ADC circuit 236 or the DSP circuit 106 can be provided to a microprocessor 610 or other controller circuit, such as the controller circuit 110, which can use a digital lowpass filtering or other signal processing technique to determine a DC offset component of the conditioned sensor signal. This DC offset information can be used as a feedback signal input for providing an active biasing signal that can reduce or otherwise compensate for the effect of such DC offset. In an example, the microprocessor 610 can use the feedback signal input DC offset information to control a digital-to-analog converter (DAC) circuit 612, which can be configured to generating a resulting DAC analog output signal that is based on the feedback input information about the DC offset. The resulting analog signal can optionally be filtered, such as by optionally using a lowpass filter 613, such as to attenuate noise from the output of DAC circuit 612. In an example, the lowpass filter 613 can include a second order passive RC filter, such as with a cutoff frequency that is less than or equal to 1 Hertz. The resulting optionally lowpass filtered analog signal can optionally be buffered, such as through an operational amplifier 614, such as to provide a stable but variable reference voltage bias signal to a reference voltage input of the instrumentation amplifier 220. In this way, the reference voltage input of the instrumentation amplifier 220 can be actively managed using feedback information about a magnitude of the DC offset signal present at the ADC circuit 236 or the DSP circuit 106, such as to generally reduce or negate the DC offset signal over time. Such DC or low frequency offset cancellation such as shown in the example of FIG. 6 can similarly be applied to other examples shown and described herein, such as to the examples of sensor interface circuits 104 shown in FIGS. 2, 3, and 5, such as to actively manage a reference voltage (e.g., of the instrumentation amplifier 220) using feedback information about a DC offset voltage.

For the examples of the sensor interface circuit 104 described herein, using an ultra-low noise ADC circuit 236, such as the Analog Devices, Inc. AD7172-2, AD 7173-8, or the AD7175-2 can allow front-end amplification (e.g., in the signal flow path before the ADC circuit 236) to use an analog gain less than 10. In an example, when the data rate is decimated to 6.25 Hz, such as to match an electromagnetic flow sensor 102 excitation frequency, the ADC noise is expected to be less than 1 microVolt peak-to-peak. The ADC noise can become ignorable when referred to the input via the front-end gain of 10, where the 1/f noise of the front-end circuitry is expected to be less than 0.94 microVolts peak-to-peak. Even when the front-end circuitry gain is reduced to 5, 2, or even 1, the input amplifier 1/f noise is expected to limit the noise performance, not the ADC. The FET buffered approach shown in FIG. 4 can provide even lower 1/f noise, which can allow a front-end circuitry gain as low as 4.

Moreover, the fast sampling speed of the ADC circuit 236 can make it possible to obtain thousands of samples during one excitation cycle of the electromagnetic flow sensor 102, wherein the excitation cycle of the electromagnetic flow sensor can be an even integer multiple of a power-line period. This can reduce line-power interference with the electromagnetic flow sensing. Moreover, the large number of samples obtainable can allow a higher-order digital filter (e.g., 1875 tap FIR filter), which can help provide sharp roll-off and superior noise rejection.

Figure 7:
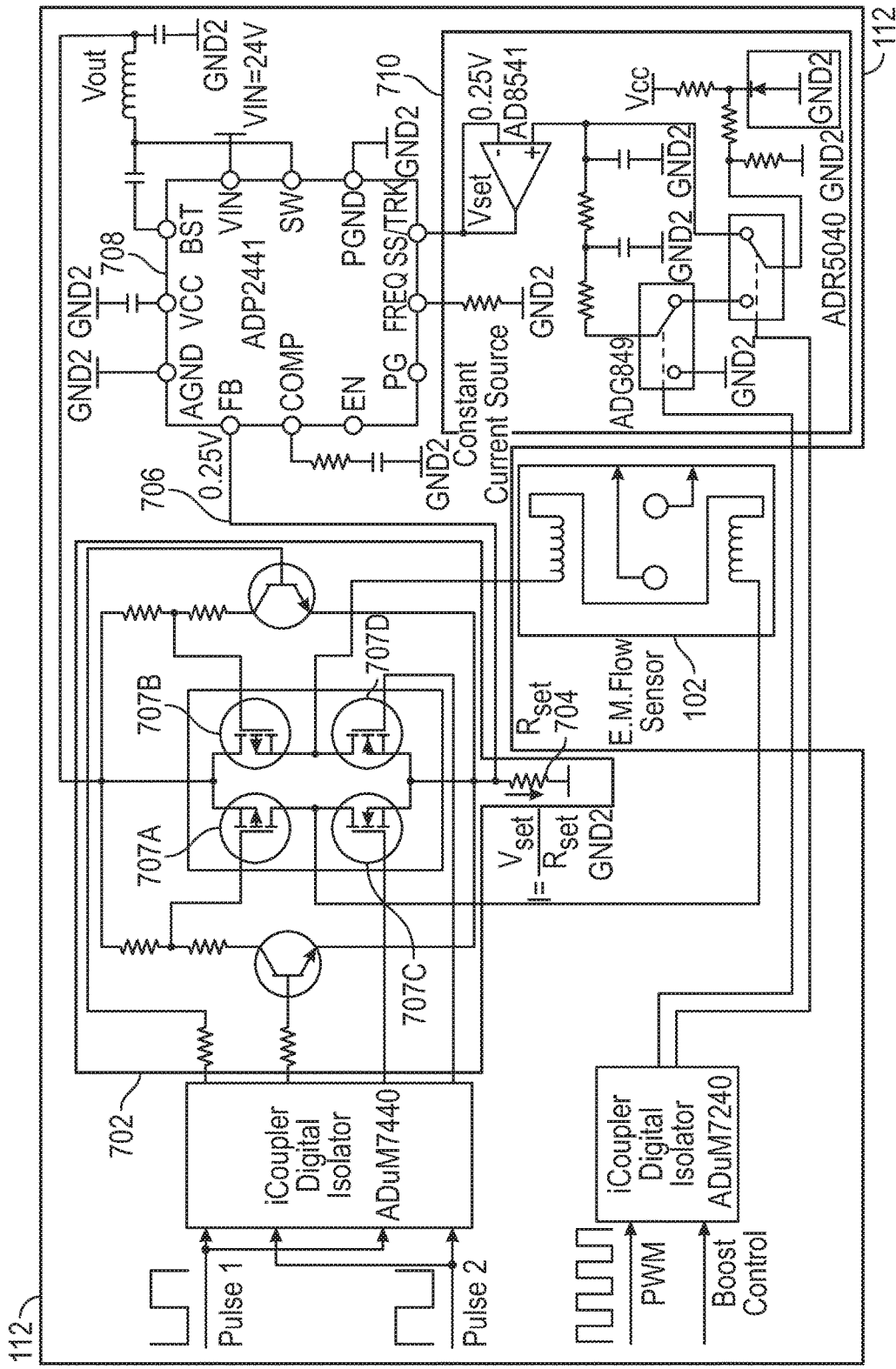
FIG. 7 shows portions of an example of a sensor excitation circuit and an example of an electromagnetic flow sensor.

FIG. 7 shows portions of an example of the sensor excitation circuit 112 and an example of the electromagnetic flow sensor 102. The sensor excitation circuit 112 can include an H-bridge circuit 702, such as to drive a coil in the electromagnetic flow sensor 102, such as to generate an electromagnetic field in a conduit in which fluid flow is being measured, such as can include sensing using the sensor electrodes of the electromagnetic flow sensor 102. The H-bridge circuit 702 can be configured to drive the coil in the electromagnetic flow sensor 102 with a specified current, such as can be generated in the H-bridge circuit 702 by a current source that can be provided by a resistor 704, such as can be located between a common source node 706 of field-effect transistors (FETs) or other transistors 707C-D located on opposing sides of the H-bridge circuit 702 and a reference node or ground node. The common source node 706 can be actively biased at a desired voltage by a switched mode power supply circuit 708, such at an appropriate voltage to provide the current to the coil in the electromagnetic flow sensor 102 via the transistors 707A-D of the H-bridge circuit 702. In an example, such active biasing can include boosting the current provided by the H-bridge circuit 702 to the coil in the electromagnetic flow sensor 102 during phase shift time periods when individual ones of the transistors 707A-D are being switched, such as by an amount that can overcome the inductance electromotive force (emf) generated during such switching. In an example, the switched mode power supply circuit 708 can include an Analog Devices, Inc. ADP2441 to generate the actively bias voltage provided at node 706 to generate the current, including during the boost current time periods.

Pulsewidth modulated (PWM) or other control signals to drive the control inputs of the transistors 707A-D of the H-bridge circuit 702 can be generated by the controller circuit 110, and delivered to the H-bridge circuit 702, such as via an electrical isolation circuit that does not require optical isolation. For example, transformer-isolation can be provided using an iCoupler® digital isolator circuit, such as an Analog Devices, Inc. ADuM7440, which includes an on-chip air-core transformer integrated onto an integrated circuit chip, such as can provide the electrical isolation between input signals received from the controller circuit 110 and output signals provided to the H-bridge circuit 702.

Current delivered to the electromagnetic flow sensor 102 can be boosted during switching of the coil of the electromagnetic flow sensor 102 using a current boost control circuit 710, which can include Analog Devices, Inc. ADG849 and ADR5040, together with Analog Devices, Inc. AD8541 to provide output signal buffering to the switched mode power supply circuit 708. Control signals to the current boost control circuit 710 can be provided by the controller circuit 110 through an electrical isolation circuit that does not require optical isolation. In an example, transformer-isolation can be provided using an iCoupler® digital isolator circuit, such as an Analog Devices, Inc. ADuM7240, which includes an on-chip air-core transformer integrated onto an integrated circuit chip, such as can provide the electrical isolation between input signals received from the controller circuit 110 and output signals provided to the current boost control circuit 710.

The controller circuit 110 can provide a pulsewidth modulated signal (PWM), such as via electrical isolation provided by the ADuM7240, to the current boost control circuit 710, such as can be received at a switch, such as a single pole, double throw switch, such as the ADG849 from Analog Devices, Inc. The PWM signal can be used to modulate a reference voltage signal, such as can be provided by a precision voltage reference circuit, such as the ADR5040 from Analog Devices, Inc.

The resulting modulated reference voltage signal in the current boost control circuit 710 can be filtered, such as using a second order passive R-C lowpass filter, and used to tune a variable voltage appearing at the SS/TRK input of the ADP2441 switched mode power supply circuit 708, after buffering by an appropriate amplifier, such as the AD8541 from Analog Devices, Inc. A higher reference voltage output by the AD8541 buffer amplifier to the SS/TRK input of the ADP2441 switched mode power supply circuit 708 results in a higher excitation current being provided to the coil of the electromagnetic flow sensor during phase transition time periods.

The BOOST CONTROL via ADuM7240 can be used to enable the boosted voltage that is applied to AD8541 non-inverting input during the phase transition period. The BOOST CONTROL signal provided via ADuM7240 can be used to disable the boosted voltage (e.g., during periods other than during switching of the coil of the electromagnetic flow sensor 102). This can be used to apply a lower voltage modulated by the PWM from the controller circuit 110, via the ADuM7240, to the non-inverting input of the AD8541, such as in a settled (non-transition) phase period. The sensor signal excitation circuit 112 shown in FIG. 7 can compare favorably with an approach using a linear regulated coil driver excitation current generator circuit, such as by taking less current and less space, while reducing or minimizing transient noise, such as by the boosted current provided during phase shifts of the excitation coil.

VARIOUS NOTES & EXAMPLES

Example 1 can include or use subject matter (such as an apparatus, a method, a means for performing acts, or a device readable medium including instructions that, when performed by the device, can cause the device to perform acts), such as can include an apparatus for processing an electromagnetic flow sensor signal. The apparatus can include first and second inputs. The first and second inputs can be configured to be respectively coupled to first and second electromagnetic flow sensor electrodes. First and second amplifiers can be configured to be respectively coupled to the first and second inputs. The first and second amplifiers can respectively be arranged in a unity-gain voltage follower configuration. A difference amplifier circuit can be coupled to receive respective output signals from the first and second amplifiers, and to output an amplified difference between the output signals from the first and second amplifiers. An analog-to-digital converter (ADC) circuit can be coupled to receive the amplified difference from the difference amplifier, and to convert the amplified difference signal into a digital signal. A dc-coupled signal path is provided from the first and second inputs, through the first and second amplifiers, and through the difference amplifier, to the ADC.

Example 2 can include, or can optionally be combined with the subject matter of Example 1, to optionally include a dc-coupled differential signal path being provided from the first and second inputs, through the first and second amplifiers, and through the difference amplifier, to the ADC.

Example 3 can include, or can optionally be combined with the subject matter of one or any combination of Examples 1-2 to optionally include the dc-coupled signal path being provided without any AC coupling capacitors in the dc-coupled signal path.

Example 4 can include, or can optionally be combined with the subject matter of one or any combination of Examples 1-3 to optionally include the first and second amplifiers including field-effect transistors (FETs) having respective gate inputs directly connected to the first and second first and second flow sensor electrodes via the first and second inputs.

Example 5 can include, or can optionally be combined with the subject matter of one or any combination of Examples 1-4 to optionally include a radio frequency interference (RFI) attenuation circuit in a signal path between the difference amplifier and the ADC.

Example 6 can include, or can optionally be combined with the subject matter of one or any combination of Examples 1-5 to optionally include the difference amplifier including an integrated difference amplifier including, on the same integrated circuit: first and second operational amplifiers; and trimmed resistors, arranged to set respective gains of the operational amplifiers and to provide a dc-coupled differential signal path through the difference amplifier.

Example 7 can include, or can optionally be combined with the subject matter of one or any combination of Examples 1-6 to optionally include a digital signal processor (DSP) circuit coupled to the ADC to receive the digital signal, wherein the digital signal includes electromagnetic flow sensor information. The DSP circuit can include a finite impulse response (FIR) bandpass digital filter circuit to condition the electromagnetic flow sensor information.

Example 8 can include, or can optionally be combined with the subject matter of one or any combination of Examples 1-7 to optionally include a DC offset compensating biasing circuit. The DC offset compensating biasing circuit can include: a digital-to-analog converter (DAC) circuit, such as can include an input configured to receive information indicating a DC offset component of the digital signal, and to produce an analog offset feedback signal responsive thereto; and a biasing circuit, such as can be configured to couple the analog offset feedback signal to a bias voltage input of the difference amplifier in a feedback arrangement that can reduce or otherwise compensate for the DC offset component of the digital signal.

Example 9 can include, or can optionally be combined with the subject matter of one or any combination of Examples 1-8 to optionally include an apparatus for processing an electromagnetic flow sensor signal, the apparatus comprising: first and second inputs, which can be configured to be respectively directly connected to first and second electromagnetic flow sensor electrodes; first and second amplifiers, which can include junction field-effect transistor (JFET) inputs that can be configured to be respectively directly connected via the first and second inputs to the first and second electromagnetic flow sensor electrodes, the first and second amplifiers can be respectively arranged in a unity-gain voltage follower configuration; a difference amplifier circuit, which can be coupled to receive respective output signals from the first and second amplifiers, and to output an amplified difference between the output signals from the first and second amplifiers; and an analog-to-digital converter (ADC) circuit, which can be coupled to receive the amplified difference from the difference amplifier, and to convert the amplified difference signal into a digital signal, and wherein a dc-coupled differential signal path can be provided, without any AC coupling capacitors, from the first and second inputs, through the first and second amplifiers, and through the difference amplifier, to the ADC; and a radio frequency interference (RFI) attenuation circuit in a signal path between the difference amplifier and the ADC, wherein the difference amplifier can include an integrated difference amplifier including, on the same integrated circuit: first and second operational amplifiers; and trimmed resistors, arranged to set respective gains of the operational amplifiers and to provide a dc-coupled differential signal path through the difference amplifier; a digital signal processor (DSP) circuit coupled to the ADC to receive the digital signal, wherein the digital signal includes electromagnetic flow sensor information, the DSP circuit including an finite impulse response (FIR) bandpass digital filter circuit to condition the electromagnetic flow sensor information; and a DC offset compensating biasing circuit including: a digital-to-analog converter (DAC) circuit, including an input configured to receive information indicating a DC offset component of the digital signal, and to produce an analog offset feedback signal responsive thereto; and a biasing circuit, which can be configured to couple the analog offset feedback signal to a bias voltage input of the difference amplifier in a feedback arrangement that reduces or otherwise compensates for the DC offset component of the digital signal.

Example 10 can include, or can optionally be combined with the subject matter of one or any combination of Examples 1-9 to optionally include a method of processing an electromagnetic flow sensor signal. The method can include: receiving first and second input signals from respective first and second electromagnetic flow sensor electrodes; buffering the first and second input signals respectively using first and second amplifiers respectively arranged in a unity-gain voltage follower configuration, to provide respective first and second buffered input signals; amplifying a difference between the first and second buffered input signals using an amplifier circuit, to respectively provide buffered and amplified first and second input signals; converting the buffered and amplified first and second input signals into a digital signal; and wherein the receiving, buffering, amplifying, and converting include providing a dc-coupled signal path through the first and second amplifiers and through the difference amplifier to the ADC.

Example 11 can include, or can optionally be combined with the subject matter of one or any combination of Examples 1-10 to optionally include the receiving, buffering, amplifying, and converting including providing a dc-coupled differential signal path through the first and second amplifiers and through the difference amplifier to the ADC.

Example 12 can include, or can optionally be combined with the subject matter of one or any combination of Examples 1-11 to optionally include the receiving first and second input signals from respective first and second electromagnetic flow sensor electrodes including directly receiving the first and second input signals at FET gates.

Example 13 can include, or can optionally be combined with the subject matter of one or any combination of Examples 1-12 to optionally include attenuating radio frequency interference (RFI) at a signal path location between amplifying the difference and converting to a digital signal.

Example 14 can include, or can optionally be combined with the subject matter of one or any combination of Examples 1-13 to optionally include digitally bandpass filtering the digital signal using a finite impulse response (FIR) bandpass digital filter circuit to condition the electromagnetic flow sensor information.

Example 15 can include, or can optionally be combined with the subject matter of one or any combination of Examples 1-14 to optionally include compensating a DC offset at the first and second electrodes, including: extracting a DC offset component of the digital signal; and biasing a reference voltage provided to a difference amplifier circuit using information about the DC offset component of the digital signal.

Example 16 can include, or can optionally be combined with the subject matter of one or any combination of Examples 1-15 to optionally include an apparatus for processing an electromagnetic flow sensor signal, the apparatus comprising: first and second inputs, which can be configured to be respectively coupled to first and second electromagnetic flow sensor electrodes; an instrumentation amplifier circuit, which can be configured to be coupled to the first and second inputs, the instrumentation amplifier circuit configured to provide a single-ended instrumentation amplifier output signal including electromagnetic flow sensor information; an analog-to-digital converter (ADC) circuit, which can be coupled to receive the instrumentation amplifier output signal including electromagnetic flow sensor information, and to convert the instrumentation amplifier output signal including electromagnetic flow sensor information into a digital signal; and wherein a dc-coupled signal path is provided from the first and second inputs, through the instrumentation amplifier, and to the ADC.

Example 17 can include, or can optionally be combined with the subject matter of one or any combination of Examples 1-16 to optionally include a single-ended-to-differential signal conversion circuit. The single-ended-to-differential signal conversion circuit can include an input that can be coupled to an output of the instrumentation amplifier circuit to receive the single-ended instrumentation amplifier output signal. First and second outputs can be coupled to respective first and second inputs of the ADC, to provide a differential signal to the ADC based on the single-ended instrumentation amplifier output signal.

Example 18 can include, or can optionally be combined with the subject matter of one or any combination of Examples 1-17 to optionally include the single-ended-to-differential signal conversion circuit including an operational amplifier, including first and second inputs and an output. First and second resistors can include a first resistor that can be coupled between the output of the operational amplifier and a first input of the operational amplifier, and a second resistor that can be coupled between the first input of the operational amplifier an output of the instrumentation amplifier circuit, to receive the single-ended instrumentation amplifier signal.

Example 19 can include, or can optionally be combined with the subject matter of one or any combination of Examples 1-18 to optionally include a DC offset compensating biasing circuit. The DC offset compensating biasing circuit can include a digital-to-analog converter (DAC) circuit, including an input configured to receive information indicating a DC offset component of the digital signal, and to produce an analog offset feedback signal responsive thereto. A biasing circuit can be configured to couple the analog offset feedback signal to a bias voltage input of the single-ended-to-differential signal conversion circuit in a feedback arrangement that reduces or otherwise compensates for the DC offset component of the digital signal.

Example 20 can include, or can optionally be combined with the subject matter of one or any combination of Examples 1-19 to optionally include the single-ended-to-differential signal conversion circuit including an integrated difference amplifier including an operational amplifier and resistors integrated on the same integrated circuit.

Example 21 can include, or can optionally be combined with the subject matter of one or any combination of Examples 1-20 to optionally include the ADC including first and second inputs, wherein a first input of the ADC can be coupled to the output of the instrumentation amplifier circuit to receive the single-ended instrumentation amplifier output signal, and wherein the second input of the ADC can be coupled to a fixed reference voltage to provide a pseudo-differential signal path through the ADC.

Example 22 can include, or can optionally be combined with the subject matter of one or any combination of Examples 1-21 to optionally include the de-coupled signal path being provided without any AC coupling capacitors in the de-coupled signal path.

Example 23 can include, or can optionally be combined with the subject matter of one or any combination of Examples 1-22 to optionally include the instrumentation amplifier including field-effect transistors (FETs) having respective gate inputs directly connected to the first and second first and second flow sensor electrodes via the first and second inputs.

Example 24 can include, or can optionally be combined with the subject matter of one or any combination of Examples 1-23 to optionally include a radio frequency interference (RFI) attenuation circuit in a signal path between the instrumentation amplifier and the ADC.

Example 25 can include, or can optionally be combined with the subject matter of one or any combination of Examples 1-24 to optionally include a radio frequency interference (RFI) attenuation circuit in a signal path between the instrumentation amplifier and the first and second inputs.

Example 26 can include, or can optionally be combined with the subject matter of one or any combination of Examples 1-25 to optionally include a digital signal processor (DSP) circuit coupled to the ADC to receive the digital signal, wherein the digital signal can include electromagnetic flow sensor information, the DSP circuit can include a finite impulse response (FIR) bandpass digital filter circuit to condition the electromagnetic flow sensor information.

Example 27 can include, or can optionally be combined with the subject matter of one or any combination of Examples 1-26 to optionally include a DC offset compensating biasing circuit that can include: a digital-to-analog converter (DAC) circuit, which can include an input configured to receive information indicating a DC offset component of the digital signal, and to produce an analog offset feedback signal responsive thereto; and a biasing circuit, which can be configured to couple the analog offset feedback signal to a bias voltage input of the instrumentation amplifier in a feedback arrangement that reduces or otherwise compensates for the DC offset component of the digital signal.

Example 28 can include, or can optionally be combined with the subject matter of one or any combination of Examples 1-27 to optionally include a method of processing an electromagnetic flow sensor signal. The method can include: receiving first and second input signals from respective first and second electromagnetic flow sensor electrodes; amplifying a difference between the first and second input signals using an instrumentation amplifier circuit, to provide a single-ended amplified signal; digitizing, using an analog-to-digital converter (ADC) circuit, to produce a digital signal based on the single-ended amplified signal; and wherein the receiving and amplifying can include providing a dc-coupled signal path through the instrumentation amplifier to the ADC.

Example 29 can include, or can optionally be combined with the subject matter of one or any combination of Examples 1-28 to optionally include converting the single-ended amplified signal to a differential signal using a single-ended-to-differential signal converter circuit, and wherein the digitizing includes digitizing the differential signal.

Example 30 can include, or can optionally be combined with the subject matter of one or any combination of Examples 1-29 to optionally include providing a pseudo-differential signal path through the ADC.

Example 31 can include, or can optionally be combined with the subject matter of one or any combination of Examples 1-30 to optionally include compensating for a dc offset voltage at the first and second electromagnetic flow sensor electrodes, the compensating including biasing at least one circuit using a reference voltage that is adjusted based on information about the dc offset voltage at the first and second electromagnetic flow sensor electrodes.

Example 32 can include, or can optionally be combined with the subject matter of one or any combination of Examples 1-31 to optionally include an apparatus for providing an excitation current to an electromagnetic flow sensor having an excitation coil and first and second sensing electrodes. The apparatus can include: an H-Bridge control circuit, which can be configured to deliver control signals to respective inputs of the first, second, third, and fourth transistors of an H-Bridge to control delivery of the specified current to the excitation coil by the H-Bridge, the H-Bridge control circuit can include: a first integrated isolation circuit, including an on-chip inductive transformer to electrically isolate and inductively couple a received input signal to the H-Bridge for controlling at least one of the first, second, third, and fourth transistors of the H-Bridge; a switched mode power supply, configured to provide an adjustable reference voltage to generate the specified current delivered to the excitation coil by the H-Bridge; and a current boost control circuit, coupled to the switched mode power supply to increase the adjustable reference voltage during a specified portion of a switching cycle of the H-Bridge to compensate for inductance emf of the excitation coil.

Example 33 can include, or can optionally be combined with the subject matter of one or any combination of Examples 1-32 to optionally include the current boost control circuit including a second integrated isolation circuit, including an on-chip inductive transformer to electrically isolate and inductively couple a received input signal, indicating the specified portion of the switching cycle of the H-Bridge, to the switched mode power supply for controlling the adjustable reference voltage and the specified current delivered to the excitation coil by the H-Bridge during the specified portion of the switching cycle of the H-Bridge.

Example 34 can include, or can optionally be combined with the subject matter of one or any combination of Examples 1-33 to optionally include the electromagnetic flow sensor having the excitation coil and first and second sensing electrodes.

Example 35 can include, or can optionally be combined with the subject matter of one or any combination of Examples 1-34 to optionally include the H-Bridge including the first, second, third, and fourth transistors configured to deliver a specified current to the excitation coil of the electromagnetic flow sensor.

Example 36 can include, or can optionally be combined with the subject matter of one or any combination of Examples 1-35 to optionally include the current boost control circuit including a reference voltage generator circuit, providing a stable reference voltage that is modulated by a pulsewidth modulated (PWM) signal to produce a PWM reference signal.

Example 37 can include, or can optionally be combined with the subject matter of one or any combination of Examples 1-36 to optionally include the current boost control circuit including a lowpass filter circuit, receiving and lowpass filtering the PWM reference signal for being provided to a tracking input of the switched mode power supply for controlling the adjustable reference voltage and the specified current delivered to the excitation coil by the H-Bridge during the specified portion of the switching cycle of the H-Bridge.

Example 38 can include, or can optionally be combined with the subject matter of one or any combination of Examples 1-37 to optionally include the current boost control circuit including a buffer amplifier circuit located between the lowpass filter circuit and the tracking input of the switched mode power supply.

Example 39 can include, or can optionally be combined with the subject matter of one or any combination of Examples 1-38 to optionally include a method of providing an electromagnetic flow sensor excitation signal, the method comprising: delivering control signals to respective inputs of the first, second, third, and fourth transistors of an H-Bridge to control delivery of a specified current to the excitation coil by the H-Bridge; electrically isolating and inductively coupling input signals from the control signals using an on-chip inductive transformer; generating an adjustable reference voltage, using a switched mode power supply circuit, to provide the specified current delivered to the excitation coil by the H-Bridge; and boosting the reference voltage and the specified current delivered to the excitation coil by the H-Bridge during a specified portion of a switching cycle of the H-Bridge to compensate for inductance emf of the excitation coil.

Example 40 can include, or can optionally be combined with the subject matter of one or any combination of Examples 1-339 to optionally include using an on-chip inductive transformer to electrically isolate and inductively couple a received input signal, indicating the specified portion of the switching cycle of the H-Bridge, to the switched mode power supply for controlling the adjustable reference voltage and the specified current delivered to the excitation coil by the H-Bridge during the specified portion of the switching cycle of the H-Bridge.

Example 41 can include, or can optionally be combined with the subject matter of one or any combination of Examples 1-40 to optionally include pulsewidth modulating a reference voltage to control a tracking input of the switched mode power supply for controlling the adjustable reference voltage and the specified current delivered to the excitation coil by the H-Bridge during the specified portion of the switching cycle of the H-Bridge.

Example 42 can include, or can optionally be combined with the subject matter of one or any combination of Examples 1-41 to optionally include lowpass filtering the pulsewidth modulated reference voltage.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus for processing an electromagnetic flow sensor signal; the apparatus comprising:
    first and second inputs configured to be respectively coupled to first and second electromagnetic flow sensor electrodes;
    an amplifier circuit configured to:
        apply a gain to a difference between the first and second inputs to amplify the difference based on a resistance coupled to the amplifier circuit; and
        output the amplified difference; and
    an analog-to-digital converter (ADC) circuit configured to receive the amplified difference from the amplifier circuit and to convert the amplified difference into a digital signal; wherein a dc-coupled signal path is provided from the first and second inputs, through the amplifier, to the ADC.

2. The apparatus of claim 1, wherein the dc-coupled signal path comprises a dc-coupled differential signal path.

3. The apparatus of claim 1, wherein the dc-coupled signal path is provided without any AC coupling capacitors in the dc-coupled signal path.

4. The apparatus of claim 1, wherein the amplifier is a difference amplifier circuit, further comprising first and second amplifiers configured to be respectively coupled to the first and second inputs, the first and second amplifiers respectively arranged in a unity-gain voltage follower configuration, wherein the difference amplifier circuit is coupled to receive respective output signals from the first and second amplifiers and apply the gain by applying the gain to a difference between the output signals of the first and second amplifiers.

5. The apparatus of claim 1, wherein the amplifier circuit includes an integrated difference amplifier including, on the same integrated circuit:
    first and second operational amplifiers; and
    trimmed resistors, arranged to set respective gains of the operational amplifiers and to provide a dc-coupled differential signal path through the amplifier circuit.

6. The apparatus of claim 1, wherein the amplified difference comprises first and second amplified difference signals, wherein the ADC is configured to receive the first and second amplified difference signals, and wherein the amplifier circuit comprises:

a first operational amplifier configured to apply a first gain to a first difference between the first and second inputs to generate the first amplified difference signal; and a second operational amplifier configured to apply a second gain to a second difference between the first and second inputs to generate the second amplified difference signal.

7. The apparatus of claim 1, further comprising a DC offset compensating biasing circuit including:

a digital-to-analog converter (DAC) circuit, including an input configured to receive information indicating a DC offset component of the digital signal, and to produce an analog offset feedback signal responsive thereto; and a biasing circuit, configured to couple the analog offset feedback signal to a bias voltage input of the amplifier circuit in a feedback arrangement that reduces or otherwise compensates for the DC offset component of the digital signal, wherein the bias voltage input of the amplifier circuit affects amplification of the difference.

8. The apparatus of claim 1 further comprising:

an H-Bridge control circuit configured to deliver control signals to respective inputs of a plurality of transistors of an H-Bridge to control delivery of specified current to an excitation coil, the H-Bridge control circuit including:

a first integrated isolation circuit including an inductive transformer to electrically isolate and inductively couple a received input signal to the H-Bridge for controlling at least one of the plurality of transistors of the H-Bridge, a switched mode power supply configured to provide a reference voltage to generate the specified current delivered to the excitation coil by the H-Bridge; and a current control circuit, coupled to the switched mode power supply to adjust the reference voltage during a specified portion of a switching cycle of the H-Bridge to compensate for inductance emf of the excitation coil.

9. The apparatus of claim 8, wherein the current control circuit increases the reference voltage during the specified portion, and wherein the current control circuit includes:

a reference voltage generator circuit, providing a stable reference voltage that is modulated by a pulsewidth modulated (PWM) signal to produce a PWM reference signal.

10. A method of processing an electromagnetic flow sensor signal, the method comprising receiving first and second input signals from respective first and second electromagnetic flow sensor electrodes;

amplifying a difference between the first and second input signals using an amplifier circuit by applying a gain to the difference based on a resistance coupled to the amplifier circuit; and converting, using an analog-to-digital converter (ADC), the amplified difference into a digital signal, and wherein the receiving, amplifying, and converting include providing a dc-coupled signal path through the amplifier circuit to the ADC.

11. The method of claim 10, wherein the dc-coupled signal path comprises a dc-coupled differential signal path.

12. The method of claim 10 further comprising buffering the first and second input signals respectively using first and second amplifiers respectively arranged in a unity-gain voltage follower configuration, to provide respective first and second buffered input signals, wherein the amplifier circuit is configured to amplify the difference by amplifying a difference between the first and second buffered input signals.

13. The method of claim 10, further comprising attenuating radio frequency interference (RFI) at a signal path location between amplifying the difference and converting to the digital signal.

14. The method of claim 10, wherein amplifying the difference comprises:

applying, with a first operational amplifier, a first gain to a first difference between the first and second inputs to generate a first amplified difference signal; and applying, with a second operational amplifier, a second gain to a second difference between the first and second inputs to generate a second amplified difference signal, wherein the ADC converts the first and second amplified difference signals.

15. The method of claim 10 further comprising compensating a DC offset at the first and second electrodes, including:

extracting a DC offset component of the digital signal; and biasing a reference voltage provided to the amplifier circuit using information about the DC offset component of the digital signal, wherein the reference voltage provided to the amplifier circuit affects amplification of the difference.

16. An apparatus for processing an electromagnetic flow sensor signal; the apparatus comprising:

means for receiving first and second input signals from respective first and second electromagnetic flow sensor electrodes;

means for amplifying a difference between the first and second input signals using an amplifier circuit by applying a gain to the difference based on a resistance coupled to the amplifier circuit; and means for converting, using an analog-to-digital converter (ADC), the amplified difference into a digital signal, and wherein the means for receiving, means for amplifying, and means for converting include means for providing a dc-coupled signal path through the amplifier circuit to the ADC.

17. The apparatus of claim 16, wherein the dc-coupled signal path comprises a dc-coupled differential signal path.

18. The apparatus of claim 16 further comprising means for buffering the first and second input signals respectively using first and second amplifiers respectively arranged in a unity-gain voltage follower configuration, to provide respective first and second buffered input signals, wherein the amplifier circuit is configured to amplify the difference by amplifying a difference between the first and second buffered input signals.

19. The apparatus of claim 16, wherein the means for amplifying the difference comprises:

means for applying with a first operational amplifier, a first gain to a first difference between the first and second inputs to generate a first amplified difference signal; and means for applying, with a second operational amplifier, a second gain to a second difference between the first and second inputs to generate a second amplified difference signal, wherein the ADC converts the first and second amplified difference signals.

20. The apparatus of claim 16 further comprising means for compensating a DC offset at the first and second electrodes, including:

means for extracting a DC offset component of the digital signal; and means for biasing a reference voltage provided to the amplifier circuit using information about the DC offset component of the digital signal, wherein the reference voltage provided to the amplifier circuit affects amplification of the difference.

* * * * *

UNITED STATES PATENT AND TRADEMARK OFFICE
CERTIFICATE OF CORRECTION

PATENT NO. : 10,480,970 B2
APPLICATION NO. : 14/975026
DATED : November 19, 2019
INVENTOR(S) : Ke Li Page 1 of 1

It is certified that error appears in the above-identified patent and that said Letters Patent is hereby corrected as shown below:

In the Claims

In Column 16, Line 26, in Claim 1, delete "signal;" and insert --signal,-- therefor In Column 16, Line 38, in Claim 1, delete "signal;" and insert --signal,-- therefor In Column 17, Line 31, in Claim 8, delete "H-Bridge," and insert --H-Bridge;-- therefor In Column 17, Line 48, in Claim 10, delete "comprising" and insert --comprising:-- therefor In Column 18, Line 28, in Claim 16, delete "signal;" and insert --signal,-- therefor In Column 18, Line 54, in Claim 19, delete "applying" and insert --applying,-- therefor Signed and Sealed this
Thirtieth Day of June, 2020

Andrei Iancu
*Director of the United States Patent and Trademark Office*